United States Patent [19]

Kobayashi et al.

[11] Patent Number: 5,252,195

[45] Date of Patent: Oct. 12, 1993

[54] PROCESS FOR PRODUCING A PRINTED WIRING BOARD

[75] Inventors: Tadashi Kobayashi; Hiroyuki Uchida; Hidetoshi Shimoda; Toshio Takahashi, all of Kawasaki, Japan

[73] Assignee: Mitsubishi Rayon Company Ltd., Tokyo, Japan

[21] Appl. No.: 980,313

[22] Filed: Oct. 28, 1992

Related U.S. Application Data

[63] Continuation of Ser. No. 746,987, Aug. 19, 1991, abandoned.

[30] Foreign Application Priority Data

Aug. 20, 1990 [JP] Japan ................... 2-218335

[51] Int. Cl.$^5$ .............................................. C25D 5/02
[52] U.S. Cl. ................................................... 205/126
[58] Field of Search ....................................... 205/126

[56] References Cited

U.S. PATENT DOCUMENTS

| | | | |
|---|---|---|---|
| 3,208,921 | 9/1965 | Hill | 204/15 |
| 3,475,284 | 10/1969 | Olson | 204/15 |
| 3,568,312 | 3/1971 | Perricone | 427/264 |
| 3,832,176 | 4/1973 | Verstraete et al. | 430/323 |

FOREIGN PATENT DOCUMENTS

| | | |
|---|---|---|
| 0189975 | 9/1986 | European Pat. Off. |
| 2161829 | 12/1971 | Fed. Rep. of Germany |
| 3412502 | 3/1984 | Fed. Rep. of Germany |
| 61-2386 | 1/1986 | Japan |

OTHER PUBLICATIONS

Patent Abstracts of Japan, vol. 14, No. 22 (E-8744)(3965), Jan. 17, 1990 & JP-A-1 264 290 (Hitachi, Ltd), Oct. 20, 1989.

Primary Examiner—T. M. Tufariello
Attorney, Agent, or Firm—Oblon, Spivak, McClelland, Maier & Neustadt

[57] ABSTRACT

A process for the production of a printed wiring board, which comprises preparing a copper-clad laminate having a through-hole formed by drilling; providing a first resist pattern on the surface of the copper-clad laminate so as to cover a portion to be formed as a conductor pattern; etching the copper-clad laminate; removing the first resist pattern; subjecting the whole laminate to an electroless copper plating; laminating a dry film resist on the copper-clad laminate; exposing and developing the dry film resist to form a second resist pattern in such a manner that the through-hole and a portion to be plated are exposed; subjecting the exposed portions to an electrolytic copper plating; removing the second resist pattern; and removing the exposed electroless copper plating through etching.

6 Claims, 4 Drawing Sheets

PROCESS FOR PRODUCING A PRINTED WIRING BOARD

This application is a continuation of application Ser. No. 07/746,987, filed on Aug. 19, 1991, now abandoned.

BACKGROUND OF THE INVENTION

1. Field of the Invention

The present invention relates to a process for the production of a printed wiring board having plated through-holes.

2. Description of the Related Art

A pattern plating process and a tenting process are known as processes for the production of a printed circuit board having plated through-holes. The pattern plating process comprises subjecting the whole copper-clad laminate, in which through-holes have been formed by drilling, to an electroless copper plating process, to thus provide an electroless copper plating on the internal surface of the through-hole or the whole surface of the laminate, subjecting the whole laminate to an electrolytic copper plating until a copper deposit having a specified thickness is formed on the internal surface of the through-hole, by using the formed electroless copper deposit, covering the laminate with a resist pattern (a negative pattern) except for a portion to be formed as a conductor pattern, subjecting the laminate to pattern plating, removing the resist pattern, and conducting etching.

In this pattern plating process, electroplating is conducted only on a pattern, and therefore, as the pattern is usually uneven, the plating thickness is uneven over the plate, and this becomes an obstacle to the subsequent resist removing, etching, and formation of a solder resist.

On the other hand, the above-described tinting process comprises subjecting the whole laminate to electrolytic copper panel plating, patterning a resist pattern (a positive pattern) on a portion to be formed as a conductor pattern, in such a manner that the upper and lower openings thereof are covered, and then conducting etching.

In this process, when a pattern mask shifts during the exposure for the formation of a resist pattern, the deposit on the inner wall of the plated through-hole is etched, and thus an electrical continuity failure occurs. Therefore, a problem arises in that a high-density printed wiring board having a small plated through-hole land width cannot be produced at a high yield by this process.

Further, in this process, since the etching for forming a conductor pattern is conducted after the whole copper-clad laminate is subjected to an electrolytic copper panel plating, the etching depth is the whole height of the conductor pattern, and becomes inevitably great and thus the advance of the etching is significant during the etching, not only in the depthwise direction but also in the lateral direction under the resist. Accordingly, in the above process, the width of the formed pattern is inaccurate, and thus it becomes difficult to produce a fine pattern.

To solve the above-described problems, Japanese Unexamined Patent (Kokai) No. 61-2386 discloses a process which comprises a step of activating a copper-clad laminate having a through-hole formed therein and forming a pattern by etching while protecting an activated catalyst within the through-hole, a step of coating the laminate, except for a desired portion, with a predetermined solder resist, and a step of depositing copper through by using a predetermined electroless copper plating solution on the through-hole and the desired portion.

In this process, however, the conductor layer necessary for the internal surface of the through-hole is formed through an electroless plating alone, and thus it is necessary to conduct the electroless plating for a long time. There is, however, no known resist capable of forming a precise pattern and withstanding an electroless copper plating solution for a long time, and thus a high-density printed wiring board cannot be produced by the above-described process.

Further, in the above-described process, since the electroless copper plating is formed in a large thickness, the change in the composition of the electroless copper plating solution is significant during the electroless copper plating, and thus it is difficult to control the plating solution.

The present invention has been made to cope with the above circumstances, and thus an object of the present invention is to provide a process for the production of a printed wiring board, by which a pattern having a high density, a high fineness and a uniform thickness can be formed at a high yield.

SUMMARY OF THE INVENTION

The process for the production of a printed wiring board according to the present invention comprises: preparing a copper-clad laminate comprising a substrate having two main surfaces and copper-clad foils on the surfaces of the insulating board, the copper-clad laminate having a through-hole; forming a first resist pattern on the surfaces of the copper-clad laminate, the first resist pattern including an area of the through-hole and an area around the through-hole; etching the copper-clad composite with the first resist pattern as a resist, to remove the copper-clad foils in an area not covered by the first resist pattern; removing the first resist pattern from the copper-clad composite; carrying out an electroless plating to form an electroless copper deposit on the surfaces of the copper-clad composite including the internal surface of the through-hole; forming a second resist pattern on the surfaces of the copper-clad composite such that an area of the through-hole and an area around the through-hole of the copper-clad composite are not covered by the second resist pattern; carrying out an copper electroplating to form an electroplated copper deposit on the surfaces of the copper-clad composite on areas not covered by the second resist patter; removing the second resist pattern from the copper-clad composite; and removing the exposed electroless plated copper deposit from the copper-clad composite.

Preferably, the second resist pattern is formed by laminating a dry film resist on the surfaces of the copper-clad composite, selectively exposing the dry film resist, and developing the exposed dry film resist.

DESCRIPTION OF THE REFERRED EMBODIMENTS

The process of the present invention will now be described in more detail, with reference to the accompanying drawings.

Figure 1:
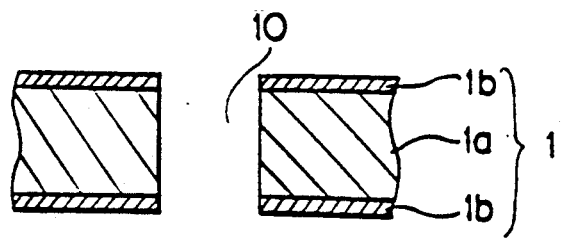
FIGS. 1 to 11 are cross-sectional views showing individual steps of an example of the process for the production of a printed wiring board according to the present invention.

In the process of the present invention, a copper-clad laminate 1 is drilled to prepare a through-hole 10 as shown in FIG. 1. The copper-clad laminate 1 shown in the drawing comprises a substrate 1a and copper foils 1b, 1b provided respectively on both surfaces of the substrate. The thickness of the copper foil 1b is selected according to the application of the printed wiring board. Preferably the copper-clad laminate 1 is first polished and chemically etched, in the present invention, to make the surfaces thereof clean. Various means such as buffing, scrubbing, or belt sanding may be utilized for the polishing. Further, various etchants, such as sulfuric acid-hydrogen peroxide and persulfuric acid salts etchants, may be utilized for the chemical etching.

Figure 2:
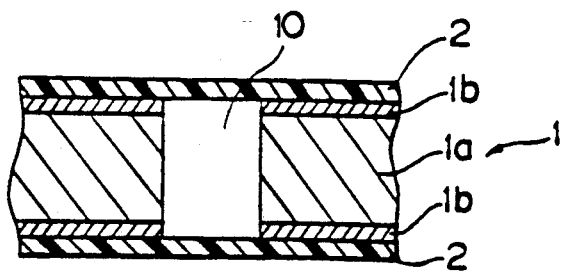
Figure 3:
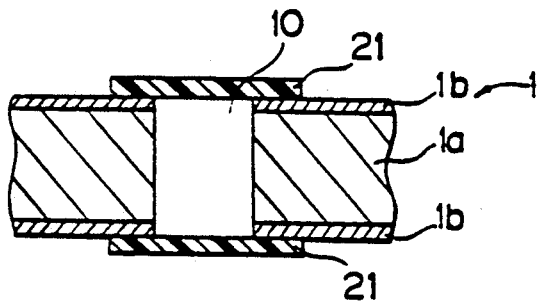

Then, a first resist pattern is formed on the copper-clad laminate 1, to cover a portion to be formed as a conductor pattern. To form the first resist pattern, a resist 2 is first formed on both whole surfaces of the laminate 1, as shown in FIG. 2. Various resists, such as a dry film resist, a liquid photoresist and an electrophoresis resist, may be used as the resist 2. Then, the laminated resist 2 is exposed and developed to form a first resist pattern 21, to cover a portion to be formed as a conductor pattern as shown in FIG. 3.

Figure 4:
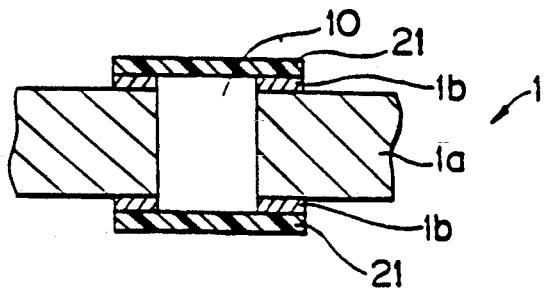

After the formation of the first resist pattern 21, etching is conducted to remove the copper foil 1b at portions not covered with the first resist pattern 21, as shown in FIG. 4. Cupric chloride, ferric chloride and ammoniacal etchants may be used as the etchant.

Figure 5:
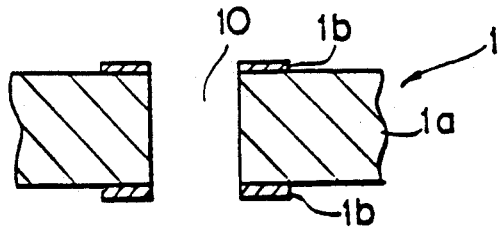
Figure 6:
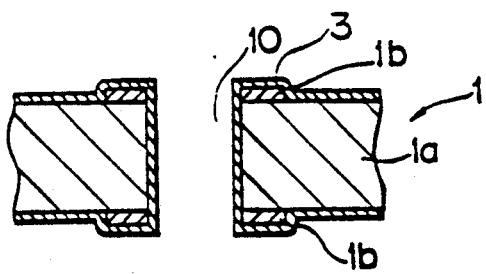

Thereafter, the first resist pattern 21 is removed, to bring the laminate 1 to a state shown in FIG. 5, and the whole laminate 1 then subjected to electroless copper plating to cover the whole laminate with an electroless plated copper layer 3, as shown in FIG. 6. The plated layer 3 is preferably made as thin as possible, unless such a thickness would be detrimental to the electrical continuity of the subsequent electroplating, and is, for example, about 1.0 to 3.0 $\mu$m.

Figure 7:
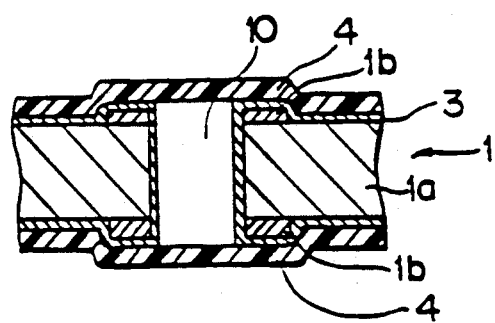

Then, as shown in FIG. 7, a dry film resist 4 is thermally laminated on the laminate. Since an uneven portion exists on the surface of the laminate 1 at this stage, preferably the laminate 1 is treated by a vacuum laminator. The thickness of the dry film resist 4 used at that time is larger than that of an electroplated layer 5 to be formed in the next step, and is usually 50 $\mu$m or more, to prevent the electroplating layer 5 to be formed in the next step from protruding into the resist. In particular, the use of a dry film resist having a thickness of 80 $\mu$m to 100 $\mu$m will improve the conformation of the resin to the panel.

Figure 8:
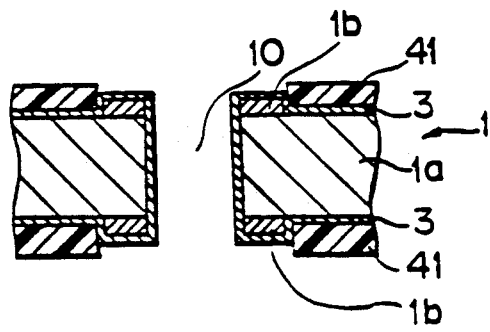

The laminated dry film resist is exposed through a positive pattern mask, and developed to form a second resist pattern 41 in such a manner that the internal surface of the through-hole 10 is exposed as shown in FIG. 8. In this case, the second resist pattern 41 is formed so that portions to be electroplated in the following step, such as the land portion and foot print portion for surface mounting devices, are also exposed.

Figure 9:
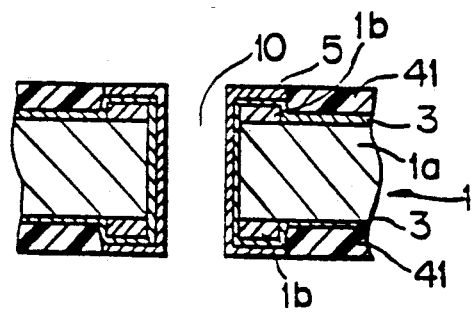

Thereafter, the copper-clad laminate 1 is subjected to electrolytic copper plating, to form an electrolytic copper deposit 5 as shown in FIG. 9. Various methods, such as copper sulfate plating, copper pyrophosphate plating and copper carbonate plating, may be adopted for the electrolytic copper plating.

Figure 10:
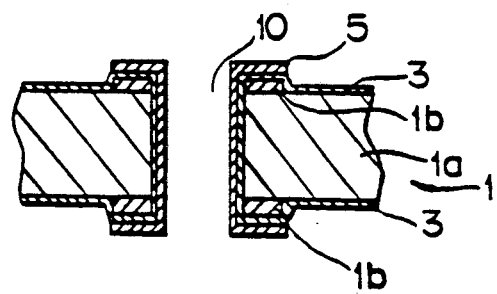

Then, the above-described second resist pattern 41 is removed, to bring the laminate to a state shown in FIG. 10. The stripping solution varies, depending upon the dry film resist used. For example, when the aqueous processable resist is used, use is made of 1 to 5% by weight of sodium hydroxide or potassium hydroxide as the stripping solution, and when the solvent processable resist is used, use is made of methylene chloride as the stripping solution.

Figure 11:
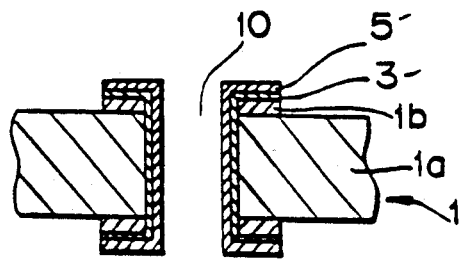

Then, the copper-clad laminate 1 is etched for a short time (quick etching) to remove the electroless plating copper layer 3 at an exposed portion not covered by the electroplating copper layer 5. Ammoniacal echant and sulfuric acid-hydrogen peroxide etchant are preferably used as the etchant. When the quick etching is completed, a printed wiring board as shown in FIG. 11 is obtained.

Figure 12:
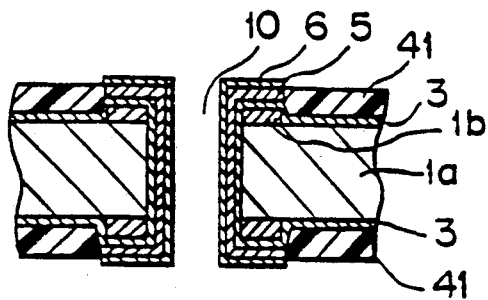
FIGS. 12 to 14 are cross-sectional views showing principal steps of the second example of the process according to the present invention.
Figure 13:
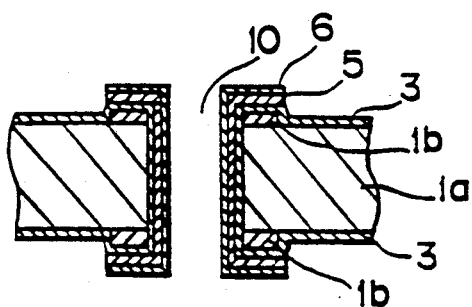
Figure 14:
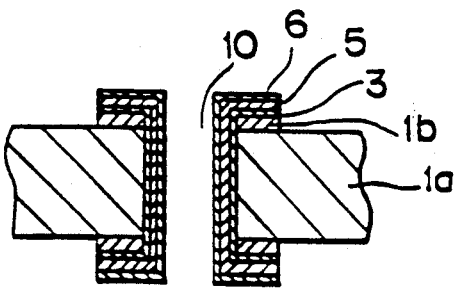

In the above-described process, it is also possible to subject the laminate 1 to electrolytic copper plating, to bring the laminate to a state shown in FIG. 9, followed by a metallic resist plating to form a metallic resist plating layer 6 as shown in FIG. 12. Examples of the metallic resist plating include tin-lead plating and tin plating, and in this case, a plating compatible with the previous and subsequent steps is selected. When the metallic resist plating layer 6 is formed in this manner, the subsequent steps are conducted such that the metallic resist plating layer 6 is deposited as shown in FIGS. 13 and 14. The panel produced such that the metallic resist plating layer 6 is deposited as shown in FIG. 14 is used after the removal of the metallic resist plating layer 6, if necessary.

Further, the panel produced by the process of the present invention may be subjected to solder fusing, according to the purpose of use of the printed wiring board.

In the process for the production of a printed wiring board according to the present invention, the electrical continuity of the through-hole is provided through electroless copper plating and electrolytic copper plating after unnecessary copper foil portions of a copper-clad laminate are first removed, and the plating layer formed on the whole copper-clad laminate is an electroless plating copper layer alone, and thus the portion to be etched in the final step is only the surface copper foil having a uniform thickness and thin electroless plating copper layer. Therefore, in the process of the present invention, a deep etching becomes unnecessary, and thus not only is the corrosion of the side of the conductor pattern to be left reduced but also the height of the conductor pattern is made uniform.

Further, in the process of the present invention, since the electrolytic copper plating is conducted only on the internal surface of the through-hole and other necessary portions, the portion to be subjected to electrolytic copper plating is dispersed, which facilitates the equalization of the line of electric force.

Further, in the process of the present invention, since the time taken for the second etching after the inside of the through-hole is made electrically conductive is short, because the second etching is conducted only for removing the thin electroless plating copper layer, the second etching has no influence on the electroplating copper layer formed on the internal surface of the through-hole, etc.

Further, in the process of the present invention, since the electroless copper plating is conducted on the whole copper-clad laminate, a resist pattern need not be provided when the electroless copper plating is conducted.

Further, in the process of the present invention, since the electrical continuity of the inside of the through-hole is provided through an electroless plating copper layer and an electroplating copper layer, the electroless plating copper layer may be thin.

In addition to the above-described advantages, in the process of the present invention, the copper foil of the copper-clad laminate is etched, an electroless plating copper layer is provided on the whole surface of the copper-clad laminate, a resist of a negative pattern is provided, and electrolytic copper plating is then conducted. Therefore, even when the copper foil portion to be left on the copper-clad laminate is accidentally etched, the required portion can be reproduced in the subsequent step.

EXAMPLE

The process for the production of a printed wiring board according to the present invention will now be described in more detail, by way of the following example.

A through-hole 10 was drilled at a predetermined position in a 2.2 mm-thick copper-clad laminate 1 having a six-layer structure, and laminated on both surfaces thereof with a 35 μm-thick copper foil 1b, 1b (see FIG. 1). Thereafter, the panel was polished to remove burrs and smears on the inside of the through-hole 10, by using permanganic acid salts.

Thereafter, the surface of the copper-clad laminate 1 was buffed by using a double form HD-SF (manufactured by 3M Company). The number of revolutions of the buffer, the oscillation thereof, and the passing velocity were 2200 r.p.m., 500 r.p.m. and 2 m/min, respectively. The panel was then washed with water, dewatered by an air knife, and then dried.

An aqueous processable dry film resist 2 was laminated thereon as shown in FIG. 2. The resist 2 used was Dialon FRA305 (manufactured by Mitsubishi Rayon Co., Ltd.) having a thickness of 50 μm. In the lamination of the resist 2, use was made of a preheater and a laminator for a dry film. The temperature of the copper-clad laminate 1 was 60° C. in a preheated state and 60° C. immediately after the lamination.

The copper-clad laminate 1 having a dry film resist 2 laminated thereon was allowed to stand for 30 min, to return the temperature thereof to room temperature. A negative pattern mask was placed on the panel, and the laminate then exposed through the use of an exposing machine. The exposure was such that 17 stages were left in the Riston Step Tablet (manufactured by du Pont) or the Dialon Step Tablet (manufactured by Mitsubishi Rayon Co., Ltd.). Then, a development was conducted for 80 sec through the use of a spray horizontal developing machine containing a 0.9 wt.% aqueous sodium carbonate solution (30° C.) as a developer. After the development, the panel was thoroughly washed with water in an attached water washing tank, and thus the copper-clad laminate 1 was brought to a state as shown in FIG. 3.

Then, the copper-clad laminate 1 was immersed in a cupric chloride etchant, to etch the copper foil 1b, to thereby bring the copper-clad laminate to a state as shown in FIG. 4. Thereafter, the resist pattern 21 was removed in a stripping tank containing, as a stripping solution, a 5 wt.% aqueous sodium hydroxide solution of 40° C. Then, the panel was successively subjected to washing with water, pickling, washing with water, dewatering, and drying to bring the panel to a state as shown in FIG. 5.

Thereafter, the whole copper-clad laminate 1 was subjected to electroless copper plating to form a 2 μm-thick electroless plating copper layer 3 as shown in FIG. 6. The electroless copper plating was conducted by a Metex 9048 electroless copper plating process (McDamid) through a cleaning step, a conditioning step, a microetching step, a sulfuric acid treatment step, a catalyst deposition step, and an acceleration step, etc.

Then, a resist 4 (Dialon FRA063 having a thickness of 50 μm manufactured by Mitsubishi Rayon Co., Ltd.) was laminated thereon by using a vacuum laminator as shown in FIG. 7. The temperature of the copper-clad laminate 1 was 60° C. in a preheated state and 60° C. immediately after the lamination.

The laminated resist 4 was exposed for 80 sec through the use of a positive pattern mask, and then developed to form a second resist pattern 41 wherein only the through-hole 10, land portion and foot print portion for surface mounting parts are exposed as shown in FIG. 8. The exposure at that time was such that 11 stages were left in the Riston Step Tablet or the Dialon Step Tablet.

Thereafter, the panel was subjected to pretreatments, such as degreasing and microetching, and then copper sulfate pattern plating, to form a 35 μm-thick electroplating copper layer 5 as shown in FIG. 9.

Subsequent to the copper sulfate pattern plating, a tin lead borofluoride plating was conducted to form an 8 μm-thick metallic resist plating layer (tin-lead plating) 6 as shown in FIG. 12.

Then, the panel was immersed in a 5 wt.% aqueous sodium hydroxide solution of 40° C., to release the second resist pattern 41, to thereby bring the panel to a state shown in FIG. 13.

Thereafter, a quick etching was conducted by an ammoniacal etchant A process (Metex), to remove the exposed electroless copper plating 3 and complete a printed wiring board as shown in FIG. 14.

Thereafter, two types of printed wiring boards were prepared by post-treating the completed printed wiring board. Specifically, one was prepared by subjecting the panel to solder fusing, and the other was prepared by releasing the metallic resist plating 6 of the panel with a solder releasing solution and then subjecting the panel to solder coating.

A solder mask was put on the printed wiring boards thus prepared, and an electric circuit test was conducted, and as a result, no problem arose with the electrical continuity, even though the first resist mask 21 was provided at a position deviated from a proper position in such a manner that the land width was zero in some portions. Further, no voids were observed within the through-hole 10.

In the above-described process, the electrical continuity of the through-hole 10 was provided through an electroless copper plating and electrolytic copper plating after unnecessary portions of a copper foil 1b portions of a copper-clad laminate 1 were first removed, and in this case, the plating layer formed on the whole copper-clad laminate 1 was electroless plating copper layer 3 alone, so that the portion to be etched in the final step was only the surface copper foil having a uniform thickness and thin electroless plating copper layer 3.

Therefore, in this process, not only could a pattern having a predetermined width be formed due to a lower susceptibility of the side of the conductor pattern to corrosion, but also the height of the conductor pattern could be made uniform.

Further, in this process, since the electrolytic copper plating was conducted only on the internal surface of the through-hole 10 and necessary portions, the electroplating copper layer 5 had a more uniform thickness than that formed by the conventional pattern plating process.

Further, in this process, since the time taken for the second etching after the electrical continuity was provided in the inside of the through-hole 10 was short, because the purpose of the second etching was to remove the thin electroless plating copper layer 3, the second etching had no influence on the electroplating copper layer 5, etc. formed on the internal surface of the through-hole 10.

Further, in this process, since the electrolytic copper plating was conducted on the whole copper-clad laminate 1, no problem arose with the resistance of the resist to the electroless copper plating solution.

Further, in this process, since the inside of the through-hole 10 was made electrically conductive through electroless plating copper and electroplating copper layers, an electroless copper plating for a short period of time obtained satisfactory results. Further, since the resist was not immersed in the plating solution, it was easy to control the quality of electroless copper plating solution.

Further, in this process, the copper foil 1b of the copper-clad laminate 1 was etched, an electroless plating copper layer 3 was then provided on the whole surface of the panel, a resist of a negative pattern was provided thereon, and an electrolytic copper plating was then conducted. Therefore, even when the copper-clad laminate 1 at the portion to be remained as a conductor pattern of the copper foil 1b was etched, the necessary portion could be reproduced in the subsequent step, and this contributed to an improvement in the yield of the printing wiring board.

As described above, in the process for the production of a printed wiring board according to the present invention, the electrical continuity of the through-hole is provided through an electroless copper plating and electrolytic copper plating after unnecessary copper foil portions of a copper-clad laminate are first removed, and the plating formed on the whole panel is an electroless copper plating alone, so that the portion to be etched in the final step is only thin electroless copper plating. Therefore, in the process of the present invention, a deep etching becomes unnecessary, and thus not only is the corrosion of the side of the conductor pattern to be remained reduced but also the height of the conductor pattern is made uniform. Therefore, according to the process of the present invention, a pattern can be formed in an accurate width and a uniform thickness, which facilitates the formation of a fine pattern.

Further, in the process of the present invention, since the electrolytic copper plating is conducted only on the internal surface of the through-hole and other necessary portions, the portion to be subjected to electrolytic copper plating is dispersed, which facilitates the equalization of the line of electric force. Therefore, in the process of the present invention, the thickness of the formed electroplating copper layer becomes more uniform.

Further, in the process of the present invention, since the time taken for the second etching after the inside of the through-hole is made electrically conductive is short, because the second etching is conducted only for removing the thin electroless plating copper layer, the second etching has no influence on the electroplating copper layer formed on the internal surface of the through-hole, etc. Therefore, according to the present invention, the accuracy of the etching is determined by the copper foil thickness alone, so that a fine pattern can be formed without detriment to the pattern plating portion.

Further, in the process of the present invention, since the electrolytic copper plating is conducted on the whole panel, there is no need to provide a resist pattern at the time of the electroless copper plating. Therefore, in the process of the present invention, no problem arises with the resistance of the resist to the electroless copper plating solution, and thus a fine pattern can be easily formed.

Further, in the process of the present invention, since the inside of through-hole is made electrically conductive through an electroless copper plating and electrolytic copper plating, the electroless plating copper layer may be thin. Therefore, in the process of the present invention, it is easy to control the quality of the plating solution for electroless copper plating.

In addition to the above-described advantages, in the process of the present invention, the copper foil of the copper-clad laminate is etched, an electroless copper plating is provided on the whole surface of the copper-clad laminate, a resist of a negative pattern is provided, and electrolytic copper plating is then conducted. Therefore, even when the copper-clad laminate at the copper foil portion thereof to be remained is accidentally etched, the necessary portion can be reproduced in the subsequent step. Therefore, according to the present invention, it is possible to improve the yield of the printed wiring board.

We claim:

1. A process for producing a printed wiring board, comprising the steps of:

preparing a copper-clad laminate comprising a substrate having two main surfaces and copper-clad foils on the surfaces of the insulating board, the copper-clad laminate having a through-hole;

forming a first resist pattern on the surfaces of the copper-clad laminate, the first resist pattern including an area of the through-hole and an area where a conductor pattern is to be formed;

etching the copper-clad composite with the first resist pattern as a resist to remove the copper-clad foils in an area not covered by the first resist pattern;

removing the first resist pattern from the copper-clad composite;

conducting an electroless plating to form an electroless plating copper layer on the surfaces of the copper-clad composite including the internal surface of the through-hole;

forming a second resist pattern on the surfaces of the copper-clad composite such that only an area of the through-hole, an area of a land portion and an area of a foot print portion for a surface mounting part, of the copper-clad composite, are not covered by the second resist pattern;

conducting an electroplating to form an electroplating copper layer on the surfaces of the copper-clad composite on areas not covered by the second resist pattern;

conducting an electroplating to form a metallic resist plating layer on the electroplating copper layer;

removing the second resist pattern from the copper-clad composite; and removing the exposed electroless plating copper layer from the copper-clad composite.

2. A process according to claim 1, wherein said second resist pattern is formed by laminating a dry film resist on the surfaces of the copper-clad composite, selectively exposing the dry film resist, and developing the exposed dry film resist.

3. A process according to claim 1, wherein said clad copper foils of said copper-clad composite are previously treated by polishing or chemical etching to make the surfaces thereof clean.

4. A process according to claim 1, wherein said electroless plating copper layer has a thickness of 1.0 to 3.0 $\mu$m.

5. A process according to claim 1, wherein said second resist pattern has a thickness thicker than that of said electroplating copper layer.

6. A process according to claim 2, wherein said dry film resist has a thickness of not less than 50 $\mu$m.

* * * * *